(12) United States Patent
Moon et al.

(10) Patent No.: US 10,793,812 B2
(45) Date of Patent: Oct. 6, 2020

(54) CLEANING COMPOSITION AND METHOD FOR FABRICATING ELECTRONIC DEVICE USING THE SAME

(71) Applicant: SK hynix Inc., Icheon-si (KR)

(72) Inventors: Ok-Min Moon, Suwon-si (KR);
Sang-Soo Kim, Icheon-si (KR);
Eung-Rim Hwang, Seoul (KR);
Jong-Young Cho, Hanam-si (KR)

(73) Assignee: SK hynix Inc., Icheon-si (KR)

( * ) Notice: Subject to any disclaimer, the term of this patent is extended or adjusted under 35 U.S.C. 154(b) by 149 days.

(21) Appl. No.: 15/909,397

(22) Filed: Mar. 1, 2018

(65) Prior Publication Data

US 2018/0346851 A1 Dec. 6, 2018

(30) Foreign Application Priority Data

May 31, 2017 (KR) .......................... 10-2017-0067506

(51) Int. Cl.
| | |
|---|---|
| *H01L 43/12* | (2006.01) |
| *C11D 11/00* | (2006.01) |
| *C11D 7/32* | (2006.01) |
| *C11D 7/08* | (2006.01) |
| *C11D 7/10* | (2006.01) |
| *H01L 21/3213* | (2006.01) |

(Continued)

(52) U.S. Cl.
CPC ............ *C11D 11/0047* (2013.01); *C11D 7/06* (2013.01); *C11D 7/08* (2013.01); *C11D 7/10* (2013.01); *C11D 7/3218* (2013.01); *H01L 21/02057* (2013.01); *H01L 21/02074* (2013.01); *H01L 21/3212* (2013.01); *H01L 21/3213* (2013.01); *H01L 21/762* (2013.01); *H01L 43/08* (2013.01); *H01L 43/12* (2013.01)

(58) Field of Classification Search
CPC .................................................. C11D 11/0047
USPC ......................................................... 510/175
See application file for complete search history.

(56) References Cited

U.S. PATENT DOCUMENTS

| | | | |
|---|---|---|---|
| 5,672,577 A | 9/1997 | Lee | |
| 6,248,704 B1 * | 6/2001 | Small ....................... | C11D 3/43 134/1.3 |

(Continued)

FOREIGN PATENT DOCUMENTS

| | | |
|---|---|---|
| KR | 10-2013-0118720 | 10/2013 |
| KR | 10-2014-0091856 | 7/2014 |
| KR | 10-2015-0111529 | 10/2015 |

OTHER PUBLICATIONS

Abriou, D. et al., Self-inhibition of water dissociation on magnesium oxide surfaces, Surface Science Letters, 1999, L527-L532, vol. 430.

(Continued)

*Primary Examiner* — Gregory E Webb
(74) *Attorney, Agent, or Firm* — Perkins Coie LLP

(57) ABSTRACT

A method for fabricating an electronic device including a semiconductor memory may include: forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14.

10 Claims, 8 Drawing Sheets

(51) Int. Cl.
*H01L 21/762* (2006.01)
*H01L 21/02* (2006.01)
*H01L 21/321* (2006.01)
*C11D 7/06* (2006.01)
*H01L 43/08* (2006.01)

(56) References Cited

U.S. PATENT DOCUMENTS

| | | | |
|---|---|---|---|
| 7,732,284 | B1 | 6/2010 | Kirkpatrick et al. |
| 9,459,961 | B2 | 10/2016 | Hoya |
| 9,460,397 | B2 | 10/2016 | Apalkov et al. |
| 9,460,768 | B2 | 10/2016 | Manipatruni et al. |
| 9,461,093 | B2 | 10/2016 | Conraux |
| 9,461,240 | B2 | 10/2016 | Sawada et al. |
| 9,461,242 | B2 | 10/2016 | Sandhu et al. |
| 9,466,787 | B2 | 10/2016 | Kula et al. |
| 9,466,789 | B2 | 10/2016 | Wang et al. |
| 2005/0089489 | A1* | 4/2005 | Carter ............... C11D 7/08 424/70.1 |
| 2006/0054597 | A1 | 3/2006 | Pemg et al. |
| 2006/0263909 | A1 | 11/2006 | Choi et al. |
| 2013/0277778 | A1 | 10/2013 | Hsu et al. |
| 2014/0227802 | A1 | 8/2014 | Hsu et al. |
| 2014/0227804 | A1 | 8/2014 | Hsu et al. |
| 2016/0218280 | A1 | 7/2016 | Park et al. |

OTHER PUBLICATIONS

Amaral, L.F. et al., Chelants to inhibit magnesia (MgO) hydration, Ceramics International, 2011, 1537-1542, vol. 37.

Misch, R.D. et al., Anodic Film Growth on Hafnium in Nitric Acid, Journal of Electrochemical Society, Mar. 1956, 153-156, vol. 103, No. 3.

Zamani, D. et al., Dynamics of Interactions Between HF and Hafnium Oxide During Surface Preparation of High-K Dielectrics, IEEE Transactions on Semiconductor Manufacturing, Aug. 2012, 511-515, vol. 25, No. 3.

Saito, S. et al., Evaluation of hafnium contamination on wafer surfaces after the wet cleaning process, Solid State Phenomena, Dec. 27, 2012, 265-268, vol. 195.

Vos, I. et al, Interplay of plasma etch, strip and wet clean in patterning La2O3/HfO2-containing high-j/metal gate stacks, Microelectronic Engineering, 2011, 21-27, vol. 88.

* cited by examiner

CLEANING COMPOSITION AND METHOD FOR FABRICATING ELECTRONIC DEVICE USING THE SAME

CROSS-REFERENCE TO RELATED APPLICATION

This patent document claims priority of Korean Patent Application No. 10-2017-0067506, entitled "CLEANING COMPOSITION AND METHOD FOR FABRICATING ELECTRONIC DEVICE USING THE SAME" and filed on May 31, 2017, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In one aspect, a cleaning composition may include water and a fluorine-containing compound or an amine, and have a pH in a range of 7 to 14.

Implementations of the above cleaning composition may include one or more the following.

The fluorine-containing compound may include HF, NaF, KF, $AlF_3$, $HBF_4$, $NH_4F$, $NH_4HF_2$, $NaHF_2$, $KHF_2$, or $NH_4BF_4$, or a combination thereof. The fluorine-containing compound may be included in an amount of 1 to 40 wt % of a total weight of the cleaning composition. The amine may include hydroxylamine, alkylamine, alkanolamine, or an aromatic amine, or a combination thereof. The amine may be included in an amount of 1 to 30 wt % of a total weight of the cleaning composition. The cleaning composition may have a pH in a range of 9 to 11. The cleaning composition may include a pH adjusting agent for controlling the pH of the cleaning composition, the pH adjusting agent including $NH_4OH$, KOH, NaOH, or TMAH (trimethylammonium hydroxide), or a combination thereof. The cleaning composition may further include one or more including a chelating agent, an inhibiting agent or a surfactant. The cleaning composition may serve to remove a metal polymer or a metal oxide deposited on sidewalls of a pattern which includes a non-magnetic material layer.

In another aspect, a method for fabricating an electronic device including a semiconductor memory may include: forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14.

Implementations of the above method for fabricating the electronic device may include one or more the following.

The etch residue may include a metal polymer, or a metal oxide, or a combination thereof. The metal may include Hf, Fe, Al, Co, Mg, Zr, Nb, Mo, Ta, W, or Ti, or a combination thereof. The material pattern may include a layer including a non-magnetic material. The non-magnetic material may include an insulating oxide. The fluorine-containing compound may include HF, NaF, KF, $AlF_3$, $HBF_4$, $NH_4F$, $NH_4HF_2$, $NaHF_2$, $KHF_2$, or $NH_4BF_4$, or a combination thereof. The fluorine-containing compound may be included in an amount of 1 to 40 wt % of a total weight of the cleaning composition. The amine may include hydroxylamine, alkylamine, alkanolamine, or an aromatic amine, or a combination thereof. The amine may be included in an amount of 1 to 30 wt % of a total weight of the cleaning composition. The cleaning composition may have a pH in a range of 9 to 11. The cleaning composition may include a pH adjusting agent for controlling the pH of the cleaning composition, the pH adjusting agent including $NH_4OH$, KOH, NaOH, or TMAH (trimethylammonium hydroxide), or a combination thereof. The cleaning composition may further include one or more including a chelating agent, an inhibiting agent or a surfactant.

In still another aspect, a method for fabricating an electronic device including a semiconductor memory may include: forming a buffer layer over a substrate; forming an MTJ (Magnetic Tunnel Junction) structure over the buffer layer to include a free layer having a variable magnetization direction, a pinned layer having a fixed magnetization direction, and a tunnel barrier layer interposed therebetween; forming a buffer layer pattern and an MTJ structure pattern by selectively etching the buffer layer and the MTJ structure, the etching of the buffer layer and the MTJ structure providing an etch residue on sidewalls of the buffer layer pattern and the MTJ pattern; and removing the etch residue, wherein the removing of the etch residue includes performing a cleaning process using a cleaning composition including water and a fluorine-containing compound or an amine, and having a pH in a range of 7 to 14.

Implementations of the above method for fabricating the electronic device may include one or more the following.

The buffer layer may include Hf, Mg, Zr, Nb, Mo, Ta, W, or Ti, or a combination thereof. The tunnel barrier layer may include MgO, CaO, SrO, TiO, VO, or NbO, or a combination thereof. The etching may be performed through a physical etch process by an IBE (Ion Beam Etching) process or an RIE (Reactive Ion Etching) process. The etch residue may include a metal polymer, or a metal oxide, or a combination thereof. The metal may include Hf, Fe, Al, Co, Mg, Zr, Nb, Mo, Ta, W, or Ti, or a combination thereof. The cleaning process may not cause damage to the buffer layer pattern and the MTJ pattern. The fluorine-containing compound may include HF, NaF, KF, AlF$_3$, HBF$_4$, NH$_4$F, NH$_4$HF$_2$, NaHF$_2$, KHF$_2$, or NH$_4$BF$_4$, or a combination thereof. The fluorine-containing compound may be included in an amount of 1 to 40 wt % of a total weight of the cleaning composition. The amine may include hydroxylamine, alkylamine, alkanolamine, or an aromatic amine, or a combination thereof. The amine may be included in an amount of 1 to 30 wt % of a total weight of the cleaning composition. The cleaning composition may have a pH in a range of 9 to 11. The cleaning composition may include a pH adjusting agent for controlling the pH of the cleaning composition, the pH adjusting agent including NH$_4$OH, KOH, NaOH, or TMAH (trimethylammonium hydroxide), or a combination thereof. The cleaning composition may further include one or more including a chelating agent, an inhibiting agent or a surfactant.

These and other aspects, implementations and associated advantages are described in greater detail in the drawings, the description and the claims.

DETAILED DESCRIPTION

Figure 1A:
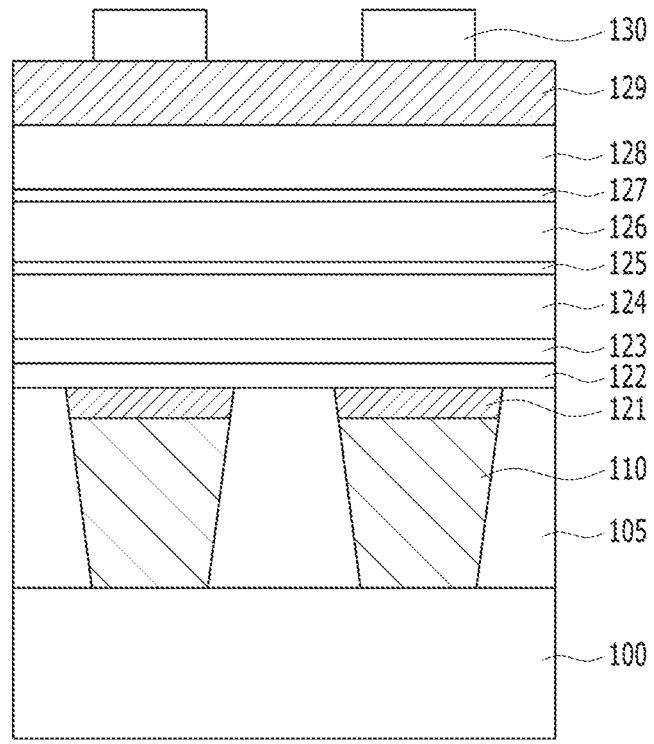
FIGS. 1A and 1B are cross-sectional views illustrating a semiconductor memory and a method for fabricating the same in accordance with a comparative example.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer substrate may not reflect all layers present in that particular multilayer substrate (e.g., one or more additional layers can be present between two illustrated layers). As a specific example, when a first layer in a described or illustrated multi-layer substrate is referred to as being "on" or "over" a second layer or "on" or "over" a substrate, the first layer may be directly formed on the second layer or the substrate but may also represent a substrate where one or more other intermediate layers may exist between the first layer and the second layer or the substrate.

Prior to explaining implementations of the present disclosure, a semiconductor memory and a method for fabricating the same in accordance with a comparative example will be explained.

Figure 1B:
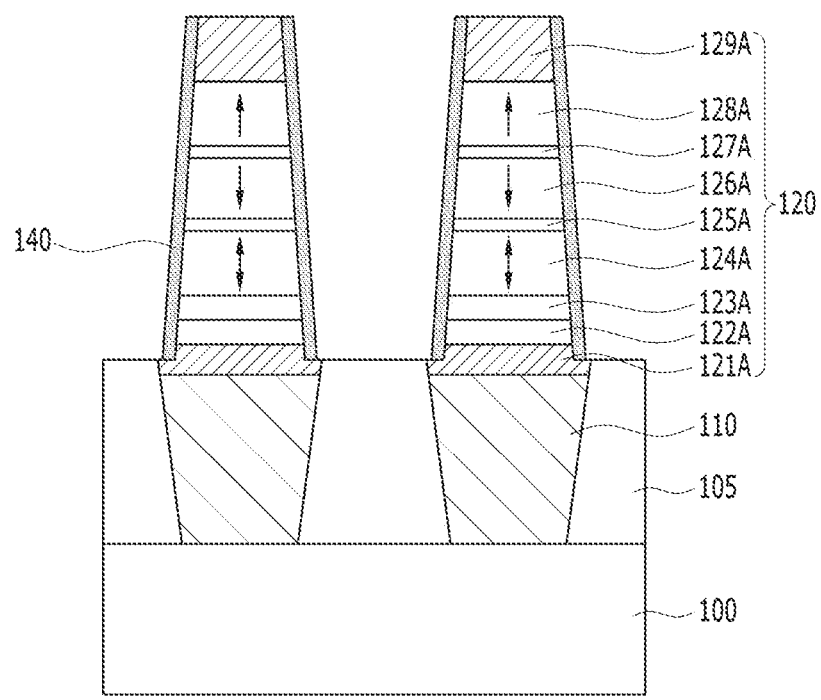

FIGS. 1A and 1B are cross-sectional views illustrating a semiconductor memory and a method for fabricating the same in accordance with a comparative example.

Referring to FIG. 1A, an interlayer dielectric layer 105 may be formed over a substrate 100.

The interlayer dielectric layer 105 may be selectively etched to form a hole exposing a portion of the substrate 100 and the lower contact plug 110 filling a lower portion of the hole may be formed.

Then, a bottom electrode layer 121 of a variable resistance element disposed over the lower contact plug 110 and filling the remaining portion of the hole may be formed. The bottom electrode layer 121 is a part of the variable resistance element and may be distinguished from the lower contact plug 110 which is coupled to a lower end of the variable resistance element in order to connect the variable resistance element to another element. The bottom electrode layer 121 is buried in the hole, which makes the number of layers to be etched during an etch process for forming the variable resistance element reduced, thereby facilitating the etch process. The bottom electrode layer 121 may be formed by forming a conductive material having a thickness enough to fill the hole in which the lower contact plug 110 is formed and performing a planarization process such as a chemical mechanical polishing (CMP) process until a top surface of the interlayer dielectric layer 105 is exposed. As a result, the bottom electrode layer 121 may have a planarized top surface. Moreover, the bottom electrode layer 121 and the lower contact plug 110 may have sidewalls aligned with each other.

Then, material layers 122 to 129 for forming the remaining part of the variable resistance element except for the bottom electrode layer 121 may be formed over the interlayer dielectric layer 105 and the bottom electrode layer 121. In this implementation, the material layers 122 to 129 may include a buffer layer 122, a seed layer 123, a free layer 124, a tunnel barrier layer 125, a pinned layer 126, an exchange coupling layer 127, a magnetic correction layer 128 and a capping layer 129 which are sequentially stacked. The free layer 124 having a variable magnetization direction, the pinned layer 126 having a fixed magnetization direction and the tunnel barrier layer 125 interposed between the free layer 124 and the pinned layer 126 and allowing the tunneling of electrons in both data reading and data writing operations may form an MTJ (Magnetic Tunnel Junction) structure. The seed layer 123 may be disposed below the free layer 124 and help the free layer 124 in growing with the desired crystal structure and/or lattice structure. The buffer layer 122 may be interposed between the bottom electrode layer 121 and the seed layer 123 so that the bottom electrode layer 121 does not affect the crystallinity of the seed layer 123. The magnetic correction layer 128 may be disposed over the pinned layer 126 and offset or reduce an influence of a stray field produced by the pinned layer 126. The magnetic correction layer 128 may have a magnetization direction anti-parallel to the magnetization direction of the pinned layer 126. The exchange coupling layer 127 may be interposed between the pinned layer 126 and the magnetic correction layer 128 and provide an exchange coupling therebetween. The capping layer 129 may be positioned at a top of the variable resistance element and function as both a top electrode of the variable resistance element and a hard mask for patterning the variable resistance element as described below.

A mask pattern 130 for patterning the variable resistance element may be formed over the capping layer 129. The mask pattern 130 may overlap with the bottom electrode layer 121, and a width of the mask pattern 130 may be smaller than a width of the bottom electrode layer 121. In particular, although a width of a stacked structure (see the reference numerals 122A to 129A of FIG. 1B) to be described below is increased downwardly, the width of the mask pattern 130 can be adjusted such that a width of a bottom surface of the stacked structure 122A to 129A is smaller than a width of a top surface of the bottom electrode layer 121. This is because it is important that layers of the variable resistance element are located on a planarized surface in order to secure the characteristics of the variable resistance element. For example, if a tunnel barrier layer pattern (see the reference numeral 125A of FIG. 1B) is positioned at the boundary between the bottom electrode layer 121 and the interlayer dielectric layer 105 an bent, the characteristics of the variable resistance element may be deteriorated due to Neel Coupling effect. Accordingly, in order to avoid this problem, it is desirable that the bottom surface of the stacked structure 122A to 129A overlaps with the top surface of the bottom electrode layer 121 and has a width smaller than that of the top surface of the bottom electrode layer 121 so that the whole bottom surface of the stacked structure 122A to 129A comes in contact with the planarized surface of the bottom electrode layer 121.

Referring to FIG. 1B, the capping layer 129, the magnetic correction layer 128, the exchange coupling layer 127, the pinned layer 126, the tunnel barrier layer 125, the free layer 124, the seed layer 123 and the buffer layer 122 may be etched using the mask pattern 130 as an etch barrier to form a buffer layer pattern 122A, a seed layer pattern 123A, a free layer pattern 124A, a tunnel barrier layer pattern 125A, a pinned layer pattern 126A, an exchange coupling layer pattern 127A, a magnetic correction layer pattern 128A and a capping layer pattern 129A. When a width of a bottom surface of the stacked structure 122A to 129A is smaller than that of a top surface of the bottom electrode layer 121, a portion of the bottom electrode layer 121 may be exposed by forming the stacked structure 122A to 129A.

In this case, an over etch process may be performed to separate the adjacent stacked structures 122A to 129A from each other, and as a result, the exposed portion of the bottom electrode layer 121 and the interlayer dielectric layer 105 may be etched. The bottom electrode layer 121 in which a portion is etched may be referred to as a bottom electrode 121A. As such, a variable resistance element 120 in which the bottom electrode 121A, the buffer layer pattern 122A, the seed layer pattern 123A, the free layer pattern 124A, the tunnel barrier layer pattern 125A, the pinned layer pattern 126A, the exchange coupling layer pattern 127A, the magnetic correction layer pattern 128A and the capping layer pattern 129A are stacked may be formed. A lower portion of the bottom electrode 121A may be buried in the interlayer dielectric layer 105 and an upper portion of the bottom electrode 121A may protrude from the interlayer dielectric layer 105. The mask pattern 130 may be removed during this etch process or by a separate removal process.

Meanwhile, during the etch process for forming the variable resistance element 120, etch byproducts derived from the objects, i.e., layers, to be etched may be redeposited on a surface to be etched. As a result, an etch residue 140 due to such redeposited etch byproducts may be formed on sidewalls of the variable resistance element 120 after patterning the variable resistance element 120. The etching is performed in a downward direction and thus, among the layers of the variable resistance element 120, the layers located above are etched earlier than the layers located below. The byproducts included in the etch residue 140 are mostly from the layers etched at a later timing, i.e., the layers located below, and rarely from the layers etched at an earlier timing, i.e., the layers located above. This is because the byproducts from the layer etched relatively earlier are redeposited during the subsequent etch process and the redeposited byproducts are mostly removed again as the etch process proceeds.

As a result, the etch residue 140 formed on the sidewalls of the variable resistance element 120 may mainly include materials included in the buffer layer pattern 122A and the bottom electrode 121A. Although the bottom electrode 121A is located under the buffer layer pattern 122A and may be etched at last, the etch residue 140 includes materials of the buffer layer pattern 122A as well as the materials of the bottom electrode 121A. The reason is that the bottom electrode layer 121 is etched by an over etch process and thus the etch byproducts derived from the buffer layer 122 may not be sufficiently removed during the etch process on the bottom electrode layer 121. The buffer layer pattern 122A and the bottom electrode 121A may include a metal-containing material such as a metal, a metal nitride, or others. Therefore, the etch residue 140 includes a metal polymer, a metal oxide, or others, and the metal may cause a problem of metallic bridge. Moreover, the etch residue 140 formed on the sidewalls of the variable resistance element 120 increases the stress on the variable resistance element 120 which causes the layers included in the variable resistance element 120 to bend. In this case, the deformation of the layers occurs and the flatness deteriorates. As a result, magnetization characteristics of the variable resistance element 120 may be deteriorated.

In order to overcome such problems, it is required to remove the etch residue 140 formed on the sidewalls of the variable resistance element 120. It is common to use a wet etching to remove the etch residue. However, if a common wet etch process is applied in order to remove the etch residue 140, it affects the patterns constituting the variable resistance element 120 to cause damage to the variable resistance element 120. In particular, since the tunnel barrier layer pattern 125A or others formed of or including a non-magnetic material is largely lost in aqueous solution, it is difficult to apply a wet etch process.

In accordance with implementations of the present disclosure, a cleaning composition and a method for fabricating a semiconductor memory using the same are provided to selectively and effectively remove the etch residue formed on the sidewalls of the variable resistance element while the layers constituting the variable resistance element are not affected.

FIGS. 2A to 2F are cross-sectional views illustrating a semiconductor memory and a method for fabricating the same in accordance with an implementation of the present disclosure.

Figure 2A:
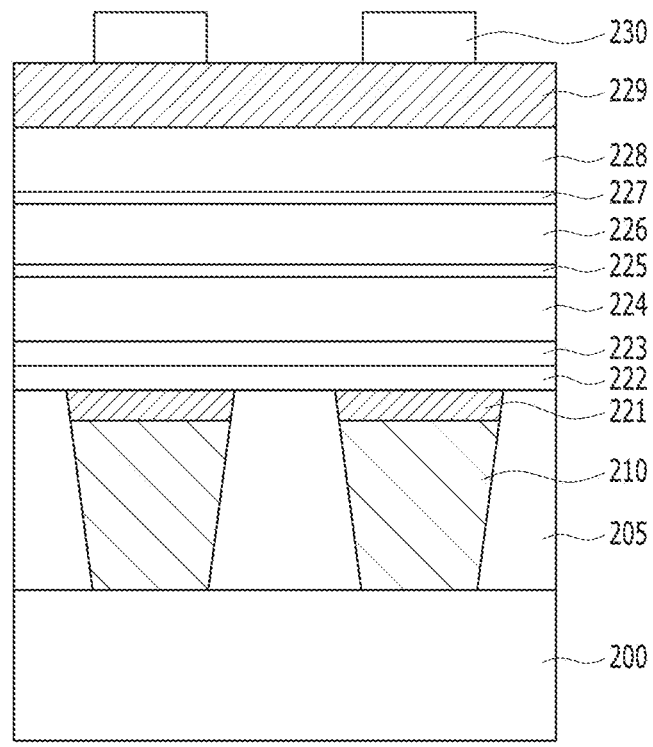
FIGS. 2A to 2F are cross-sectional views illustrating an exemplary semiconductor memory and a method for fabricating the same in accordance with an implementation of the present disclosure.

Referring to FIG. 2A, a substrate 200 where predetermined required structures such as a switching device (not shown), are formed may be provided. Here, the switching device may be coupled to a variable resistance element to control the supply of a current or voltage to the variable resistance element. For example, the switching device may include a transistor or a diode. The switching device may have one end to be electrically connected to a lower contact plug 210, which is to be described below, and the other end to be electrically connected to a line that is not illustrated in the drawing, such as a source line.

A first interlayer dielectric layer 205 may be formed over the substrate 200. The first interlayer dielectric layer 205 may include various insulating materials such as silicon oxide, or silicon nitride, or a combination thereof.

The lower contact plug 210 may be formed to pass through the first interlayer dielectric layer 205 and be coupled to a portion of the substrate 200. For example, the lower contact plug 210 may be coupled to an end of the switching element of the substrate 200. The lower contact plug 210 may be formed by selectively etching the first interlayer dielectric layer 205 to form a contact hole exposing a portion of the substrate 200, depositing a conductive material in a thickness that sufficiently fills the contact hole and performing an etch-back process or other etching processes to the desired height. The lower contact plug 210 may include a conductive material having an excellent filling property and high electrical conductivity, for example, a metal such as tungsten (W), tantalum (Ta), or any other metal, or a metal nitride such as titanium nitride (TiN), or others.

A bottom electrode layer 221 of a variable resistance element 220 disposed over the lower contact plug 210 and filling the remaining portion of the hole may be formed. The bottom electrode layer 221 is a part of the variable resistance element and may be distinguished from the lower contact plug 210 which is coupled to a lower end of the variable resistance element 220 in order to connect the variable resistance element 220 to another element. The bottom electrode layer 221 may be formed by forming a conductive material having a thickness enough to fill the hole in which the lower contact plug 210 is formed and performing a planarization process such as a CMP process until a top surface of the first interlayer dielectric layer 205 is exposed. As a result, the bottom electrode layer 221 may have a planarized top surface. By burying the bottom electrode layer 221 in the hole, it is possible to reduce a total thickness of layers to be etched during an etch process for forming the variable resistance element 220. Accordingly, it is possible to facilitate the etch process.

The bottom electrode layer 221 may include a metal-containing material. For example, the bottom electrode layer 221 may have a single-layer structure or a multi-layer structure including a metal such as Hf, Fe, Al, Mg, Zr, Nb, Mo, Ta, W or Ti, or others, an oxide of the metal or a nitride of the metal.

Then, the bottom electrode layer 221 and the lower contact plug 210 may have sidewalls aligned with each other.

Then, a material layers 222 to 229 for forming the remaining part of the variable resistance element except for the bottom electrode layer 221 may be formed over the first interlayer dielectric layer 205 and the bottom electrode layer 221. In this implementation, the material layers 222 to 229 may include a buffer layer 222, a seed layer 223, a free layer 224, a tunnel barrier layer 225, a pinned layer 226, an exchange coupling layer 227, a magnetic correction layer 228 and a capping layer 229.

Here, the free layer 224 having a variable magnetization direction, the pinned layer 226 having a fixed magnetization direction and the tunnel barrier layer 225 interposed between the free layer 224 and the pinned layer 226 allowing the tunneling of electrons in both data reading and data writing operations may form an MTJ structure.

The free layer 224 may have a variable magnetization direction that changes between different directions to cause the MTJ structure to have a variable resistance value. With the change of the magnetization direction of the free layer 224, the relative relationship of the magnetization directions of the free layer 224 and the pinned layer 226 also changes, which allows the variable resistance element 220 to store different data or represent different data bits. The free layer 224 may also be referred as a storage layer or the like. The magnetization direction of the free layer 224 may be substantially perpendicular to a surface of the free layer 224, the tunnel barrier layer 225 and the pinned layer 226. In other words, the magnetization direction of the free layer 224 may be substantially parallel to stacking directions of the free layer 224, the tunnel barrier layer 225 and the pinned layer 226. Therefore, the magnetization direction of the free layer 224 may be changed between a downward direction and an upward direction. The change in the magnetization direction of the free layer 224 may be induced by spin transfer torque.

The free layer 224 may have a single-layer or multilayer structure including a ferromagnetic material. For example, the free layer 224 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or the like, or may include a stack of metals, such as Co/Pt, or Co/Pd, or the like.

The tunnel barrier layer 225 may allow the tunneling of electrons in both data reading and data writing operations. In a write operation for storing new data, a high write current may be directed through the tunnel barrier layer 225 to change the magnetization direction of the free layer 224 and thus to change the resistance state of the MTJ for writing a new data bit. In a reading operation, a low reading current may be directed through the tunnel barrier layer 225 without changing the magnetization direction of the free layer 224 to measure the existing resistance state of the MTJ under the existing magnetization direction of the free layer 224 to read the stored data bit in the MTJ. The tunnel barrier layer 225 may include a dielectric oxide, for example, an oxide such as MgO, CaO, SrO, TiO, VO, or NbO or the like.

The pinned layer 226 may have a pinned magnetization direction which contrasts with the magnetization direction of the free layer 224, and may be referred to as a reference layer or the like. In some implementations, the magnetization direction of the pinned layer 226 may be pinned in a downward direction. In some implementations, the magnetization direction of the pinned layer 226 may be pinned in an upward direction.

The pinned layer 226 may have a single-layer or multi-layer structure including a ferromagnetic material. For example, the pinned layer 226 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or the like.

In some implementations, the positions of the free layer 224 and the pinned layer 226 with respect to the tunnel barrier layer 225 may be changed with each other. For example, the free layer 224 may be disposed on the tunnel barrier layer 225 and the pinned layer 226 may be disposed under the tunnel barrier layer 225 and over the seed layer 223.

The seed layer 223 may help a magnetic layer disposed on the seed layer 223 to grow to have a desired crystalline structure and/or lattice structure. For example, the seed layer 223 may have a crystalline structure so as to improve perpendicular magnetic crystalline anisotropy of the magnetic layer disposed on the seed layer 223. In one implementation, the seed layer 223 may be disposed under the free layer 224 and help a growth of the free layer 224. However, in another implementation, when the pinned layer 226 is disposed on the seed layer 223, the seed layer 223 may help a growth of the pinned layer 226. The seed layer 223 may include a metal-containing material. For example, the seed layer 223 may have a single-layer structure or a multi-layer structure including a metal such as Hf, Mg, Zr, Nb, Mo, Ta, W, or Ti, or an oxide of the metal or nitride of the metal.

The buffer layer 222 may be interposed between the bottom electrode layer 221 and the seed layer 223 so that the bottom electrode layer 221 does not exert an influence on the crystallinity of the seed layer 223. The buffer layer 222 may include a metal-containing material. For example, the buffer layer 222 may have a single-layer structure or a multi-layer structure including a metal such as Hf, Mg, Zr, Nb, Mo, Ta, W, or Ti, or others, or an oxide of the metal or a nitride of the metal.

The magnetic correction layer 228 may be disposed on the pinned layer 226 and offset or reduce an influence of a stray field generated by the pinned layer 226 so as to reduce a bias magnetic field in the free layer 224 due to the stray field of the pinned layer 226. For this purpose, the magnetic correction layer 228 may have a magnetization direction opposite to that of the pinned layer 226 and have a single-layer structure or a multi-layer structure including a ferromagnetic material.

The exchange coupling layer 227 may be interposed between the pinned layer 226 and the magnetic correction layer 228 to provide an exchange coupling therebetween. Specifically, the exchange coupling layer 227 may provide an exchange coupling between the pinned layer 226 and the magnetic correction layer 228 so as to have magnetization directions anti-parallel to each other. The exchange coupling layer 227 may include a noble metal such as Ru, or others.

The capping layer 229 may be disposed in an uppermost portion of the variable resistance element 220 to function as both an upper electrode of the variable resistance element 220 and a hard mask for patterning the variable resistance element 220 as described below. On this account, the capping layer 229 may have a single-layer structure or a multi-layer structure including various conductive materials such as a metal, or metal nitride.

Then, a mask pattern 230 for patterning the variable resistance element 220 may be formed over the capping layer 229. The mask pattern 230 may overlap with the bottom electrode layer 221 and have a width smaller than a width of the bottom electrode layer 221. In some implementations, the width of the mask pattern 230 may be adjusted so that a width of a bottom surface of a stacked structure (see the reference numerals 222A to 229A of FIG. 2B) is smaller than a width of a top surface of the bottom electrode layer 221 and thus the whole stacked structure 222A to 229A is disposed over the bottom electrode layer 221. This ensures to place the layers of the variable resistance element 220 over the bottom electrode layer 221. Accordingly, the layers of the variable resistance element 220 are disposed over the planarized surface, which allows to secure characteristics of the variable resistance element 220. The mask pattern 230 may include various conductive materials such as a metal, or a metal nitride, or others.

Figure 2B:
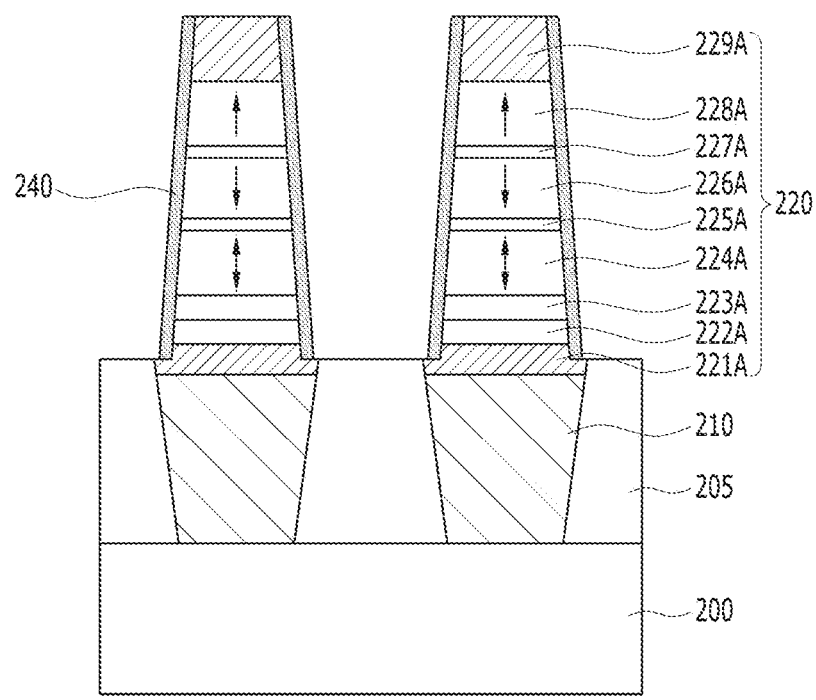

Referring to FIG. 2B, the capping layer 229, the magnetic correction layer 228, the exchange coupling layer 227, the pinned layer 226, the tunnel barrier layer 225, the free layer 224, the seed layer 223 and the buffer layer 222 may be etched using the mask pattern 230 as an etch barrier to form the stacked structure 222A to 229A in which a buffer layer pattern 222A, a seed layer pattern 223A, a free layer pattern 224A, a tunnel barrier layer pattern 225A, a pinned layer pattern 226A, an exchange coupling layer pattern 227A, a magnetic correction layer pattern 228A and a capping layer pattern 229A are sequentially stacked. This etch process may be performed by a method having a strong physical etching characteristic such as an Ion Beam Etching (IBE) or a Reactive Ion Etching (RIE). As such, the stacked structure 222A to 229A may have a width increasing downwardly. Here, a width of a bottom surface of the stacked structure 222A to 229A may be smaller than a width of a top surface of the bottom electrode layer 221 and thus a portion of the top surface of the bottom electrode layer 221 may be exposed by the stacked structure 222A to 229A.

During this etch process, an over etch process may be performed to separate the adjacent stacked structures 222A to 229A, and as a result, portions of the bottom electrode layer 221 and the first interlayer dielectric layer 205, which are exposed by forming the stacked structure 222A to 229A, may be etched. The bottom electrode layer 221 in which a portion is etched may be referred to as a bottom electrode 221A. As such, the variable resistance element 220 in which the bottom electrode 221A, the buffer layer pattern 222A, the seed layer pattern 223A, the free layer pattern 224A, the tunnel barrier layer pattern 225A, the pinned layer pattern 226A, the exchange coupling layer pattern 227A, the magnetic correction layer pattern 228A and the capping layer pattern 229A are stacked may be formed. A lower portion of the bottom electrode 221A may be buried in the first interlayer dielectric layer 205 and an upper portion of the bottom electrode 221A may protrude therefrom. Moreover, the upper portion of the bottom electrode 221A may have sidewalls which are aligned with the stacked structure 222A to 229A, while the lower portion of the bottom electrode 221A may have sidewalls which are not aligned with the stacked structure 222A to 229A. During this etch process or by a separate removal process, the mask pattern 230 may be removed. Alternatively, although it is not shown, when the mask pattern 230 includes a conductive material, a portion of the mask pattern 230 may remain.

During this etch process, etch byproducts may be redeposited on sidewalls of the variable resistance element 220 so that an etch residue 240 may be formed. The etch residue 240 may mainly include a material contained in the buffer layer pattern 222A and the bottom electrode 221A. This is because the buffer layer 222 and the bottom electrode layer 221 are the layers which are finally etched. Depending on the process, the etch residue 240 may further include metals contained in the remaining parts 223A to 229A of the variable resistance element 220. In some implementations, the etch residue 240 may include a metal polymer or a metal oxide, and the metal may include Hf, Fe, Al, Co, Mg, Zr, Nb, Mo, Ta, W, or Ti, or a combination thereof.

Figure 2C:
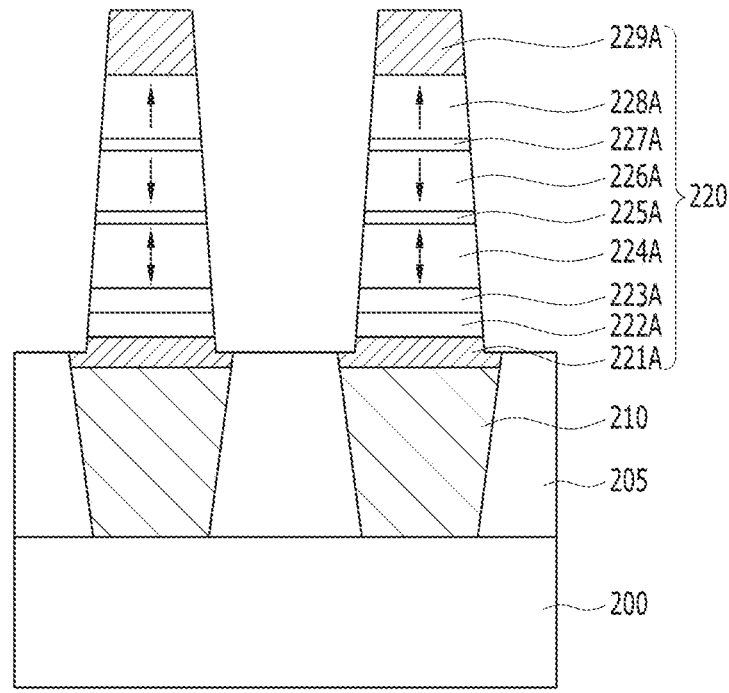

Referring to FIG. 2C, the etch residue 240 may be removed by performing a wet cleaning process on the resultant structure of FIG. 2B. In the wet cleaning process, it is important to selectively and efficiently remove only the etch residue 240 formed on the sidewalls of the variable resistance element 220 without causing loss of the patterns 221A to 229A included in the variable resistance element 220. Thus, the wet cleaning process should allow the etch residue 240 to be effectively removed, and at the same time, it does not cause damage to the patterns 221A to 229A. For example, the tunnel barrier layer pattern 225A or others, which include a non-magnetic material and thus are greatly removed in aqueous solution, need be remained without any loss.

The disclosed technology provides an exemplary cleaning composition which can be used in the wet cleaning process, to effectively remove the etch residue and do not damage the patterns 221A to 229A. The exemplary cleaning composition may include a fluorine-containing compound or an amine, and water, and have a pH in the range of 7 to 14.

The fluorine-containing compound or the amine included in the cleaning composition may serve to remove the metal polymer or metal oxide included in the etch residue 240.

The fluorine-containing compound may include a monomer, an oligomer or a polymer, which includes fluorine as a functional group. For example, the fluorine-containing compound may include HF, NaF, KF, $AlF_3$, $HBF_4$, $NH_4F$, $NH_4HF_2$, $NaHF_2$, $KHF_2$, or $NH_4BF_4$, or a combination thereof.

The fluorine-containing compound may be included in an amount of 1 to 40 wt % of the total weight of the cleaning composition. When the amount of the fluorine-containing compound is less than 1 wt %, the etching is performed in an insufficient manner and the metal polymer or metal oxide may not be completely removed. When the amount of the fluorine-containing compound is more than 40 wt %, the etching rate becomes too fast and thus, there may be a problem in controlling the process.

The amine may include a monomer, an oligomer or a polymer, which includes an amine as a functional group. For example, the amine may include hydroxylamine, alkylamine, alkanolamine, or an aromatic amine, or a combination thereof. Examples of the alkylamine may include methylamine, propylamine, dimethylamine, trimethylamine, or ethylenediamine. Examples of the alkanolamine may include monoethanolamine, diethanolamine, triethanolamine, propanolamine, dipropanolamine, tripropanolamine, monoisopropanolamine, diisopropanolamine, triisopropanolamine, butanolamine, butylmonoethanolamine, N-methylethanolamine, or ethyldiethanolamine. Examples of the aromatic amine may include aniline, o-toluidine, 2,4,6-trimethylaniline, anisidine, or N-methylaniline.

The amine may be included in an amount of 1 to 30 wt % of the total weight of the cleaning composition. When the amount of the amine is less than 1 wt %, the etching is performed in an insufficient manner and the metal polymer or metal oxide may not be completely removed. When the amount of the amine is more than 30 wt %, the etching rate becomes too fast and thus, there may be a problem in controlling the process.

In some implementations, the cleaning composition may have a pH in the range of 7 to 14, for example, in the range of 9 to 11. As such, by adjusting the pH of the cleaning composition to a basic region, it is possible to prevent or minimize damage to the layers included in the variable resistance element 220, for example, the tunnel barrier layer pattern 225A. As described above, a wet cleaning is not usually performed on the tunnel barrier layer pattern 225A since the tunnel barrier layer pattern 225A is formed of or includes a non-magnetic material and thus largely damaged in aqueous solution. Further, when the cleaning composition including the amine or the fluorine-containing compound has a pH in an acidic region, the layers included in the variable resistance element 220 may be damaged to cause a cell broken phenomenon. In this implementation, the cleaning composition includes the amine or the fluorine-containing compound, and an aqueous solvent and has a pH in a basic region, so that it is possible to selectively remove only the etch residue 240 and prevent or minimize damage to the layers included in the variable resistance element 220, for example, the tunnel barrier layer pattern 225A.

The cleaning composition may include a pH adjusting agent in order to control the pH of the cleaning composition in the range of 7 to 14, for example, in the range of 9 to 11. Examples of the pH adjusting agent may include $NH_4OH$, KOH, NaOH, or TMAH (trimethylammonium hydroxide), or a combination thereof. The amount of the pH adjusting agent may be suitably selected such that the pH of the cleaning composition falls into the basic region. For example, the pH adjusting agent may be included in an amount of 0.1 to 5 wt % of the total weight of the cleaning composition.

The cleaning composition may be based on an aqueous solvent and the water is contained with an amount of a remainder of the composition except other components of the composition. Although any water can be used for the composition, some implementations of the composition may include deionized water.

The cleaning composition may further include a chelating agent, an inhibiting agent, or a surfactant, or a combination thereof in order to improve characteristics.

The chelating agent may serve to prevent the re-adsorption of residues by forming a chelate with ions generated in the wet cleaning process for removing the etch residue 240.

Examples of the chelating agent may include diamine, beta-diketone, ethylene-diamine-tetra-acetic acid, ammonium salt, or tri- and polycarboxylic acid and a salt thereof, or a combination thereof. The diamine may include ethylene diamine, or 2-methylene-amino-propylene-diamine or others. The ammonium salt may include an organic ammonium slat such as ammonium tartrate, ammonium citrate, ammonium formate, or ammonium gluconate, and an inorganic ammonium salt such as ammonium fluoride, ammonium nitrate, ammonium thiosulfate, ammonium persulfate, ammonium bucarbonate, ammonium phosphate. The chelating agent may include a compound having an amino group and a carboxyl group. For example, the chelating agent may include iminodiacetic acid, nitrilotriacetic acid, ethylenediaminetetraacetic acid, diethylenetrinitrilpentaacetic acid, amino trimethylene phosphonic acid, (1-hydroxyethane-1, 1-diyl)bus(phosphnic acid), ethylenediamine tetra(methylene phosphonic acid), diethylenetriamine penta(methylene phosphonic acid), alanine, glutamic acid, amino butyric acid and glycine.

The chelating agent may be included in an amount of 0.1 to 5 wt % based on the total weight of the cleaning composition.

The inhibiting agent may serve to control the etching rate in the wet cleaning process for removing the etch residue 240 and suppressing corrosion of a metal so as to prevent loss of metals included in the layers 221A to 229A.

Examples of the inhibiting agent may include a compound having a nitrogen-containing functional group such as a nitrogen-containing heterocycle, an alkylammonium ion, an aminoalkyl compound or amino acid. The inhibiting agent may include a heterocyclic compound having 1 to 10 carbons and one or more hetero atom including or selected from oxygen, sulfur or nitrogen. Examples of the inhibiting agent may include 2,3,5-trimethylpyrazine, 2-ethyl-3,5-dimethylpyrazine, quinoxaline, acetyl pyrrole, pyridazine, histidine, pyrazine, or benzimidazole or a combination thereof. The inhibiting agent may include a compound having at least one functional group including or selected from a nitrogen-containing group, a thiol group or a sulfide group, such as glutathione, cysteine, 2-mercaptobenzimidazole, thiophene, mercapto pyridine N-oxide, thiamine hydrochloride, tetraethylthiuram disulfide, or 2,5-dimercapto-1,3-thiadiazole or a combination thereof.

The inhibiting agent may be included in an amount of 0.1 to 5 wt % based on the total weight of the cleaning composition.

The surfactant may serve to control surface tension depending on the aspect ratio of the pattern.

The surfactant may include an anionic surfactant, a cationic surfactant or a nonionic surfactant. Examples of the cationic surfactant may include amines such as $C_8H_{17}NH_2$, examples of the anionic surfactant may include hydrocarbon-based carboxylic acid such as $C_8H_{17}COOH$, hydrocarbon-based sulfonic acid such as $C_8H_{17}SO_3H$ or fluorine-based carboxylic acid such as $H(CF_2)_6COOH$, and examples of the nonionic surfactant may include ethers such as polyoxyalkylene alkylether.

The surfactant may be included in an amount of 0.1 to 5 wt % based on the total weight of the cleaning composition.

By the wet cleaning process using the cleaning composition, the etch residue 240 including the metal polymer or metal oxide and formed on the sidewalls of the variable resistance element 220 can be selectively and effectively removed while the layers included in the variable resistance element 220, for example, the tunnel barrier layer pattern 225A formed of a non-magnetic material, are not damaged. Accordingly, the pattern profile of the variable resistance element 220 can be maintained.

Figure 2D:
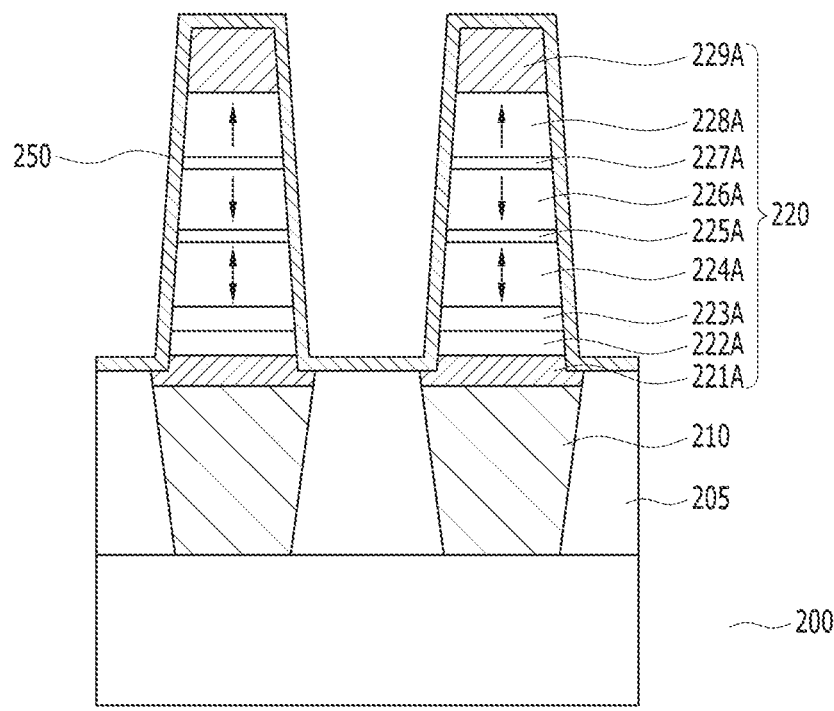

Referring to FIG. 2D, a spacer 250 may be formed along the resultant structure on which the wet cleaning process is performed. The spacer 250 serves to further protect the variable resistance element 220 and may be omitted. The spacer 250 may include various insulating materials such as silicon oxide, or silicon nitride, or a combination thereof.

Figure 2E:
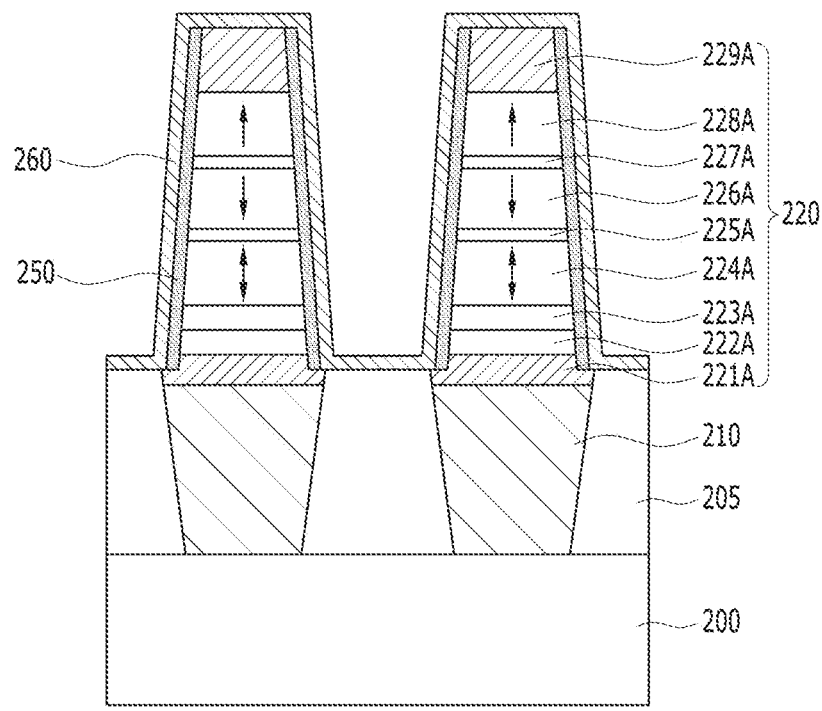

Referring to FIG. 2E, the spacer 250 may be positioned on the sidewalls of the variable resistance element 220 by performing a blanket etch process.

A protective layer 260 may be formed along the resultant structure. The protective layer 260 serves to protect the variable resistance element 220 and may be formed of or include an insulating material such as silicon nitride.

Figure 2F:
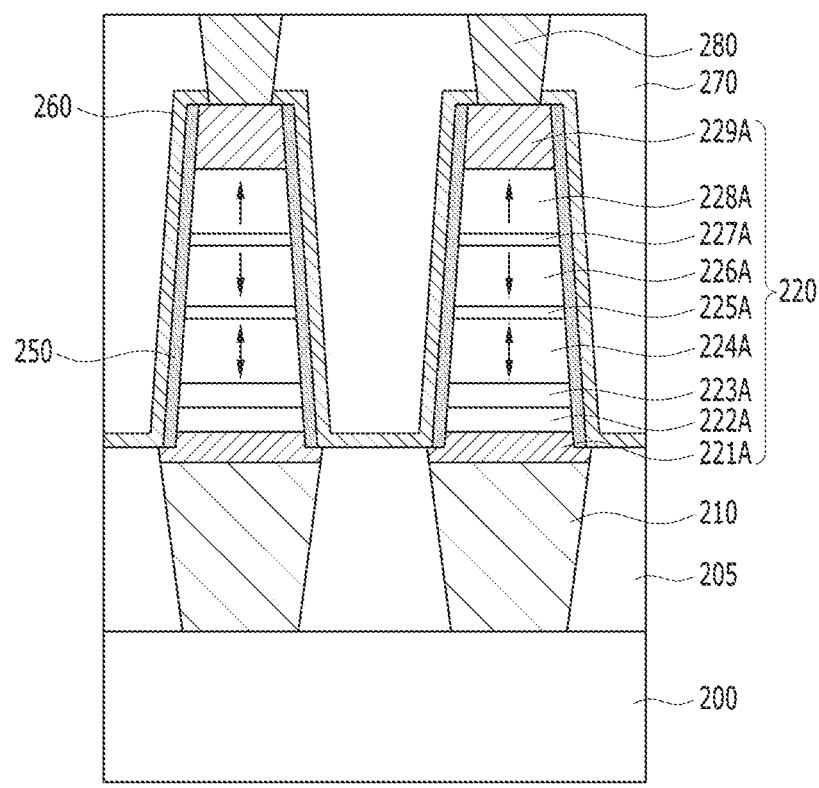

Referring to FIG. 2F, a second interlayer dielectric layer 270 may be formed to cover the resultant structure of FIG. 2E. The second interlayer dielectric layer 270 may be formed by depositing an insulating material and performing a planarization process.

An upper contact plug 280 passing through the second interlayer dielectric layer 270 and electrically coupled to an upper end of the variable resistance element 220, that is, the capping layer pattern 229A may be formed. The upper contact plug 280 may be formed by selectively etching the second interlayer dielectric layer 270 to form a contact hole exposing the capping layer pattern 229A, depositing a conductive material in a thickness that sufficiently fills the contact hole and performing a planarization process until the second interlayer dielectric layer 270 is exposed. The upper contact plug 280 may include a conductive material having an excellent filling property and high electrical conductivity, for example, a metal such as tungsten (W), tantalum (Ta), or a metal nitride such as a titanium nitride (TiN).

Subsequently, although it is not shown, lines that are electrically coupled to the upper contact plug 280, for example, bit lines, may be formed over the second interlayer dielectric layer 270 and the upper contact plug 280.

The semiconductor memory shown in FIG. 2F may be fabricated through the process described above.

Referring back to FIG. 2F, the semiconductor memory in accordance with the implementation of the present disclosure may include the lower contact plug 210 disposed over the substrate 200 and coupled to a portion of the substrate 200, the bottom electrode 221A of the variable resistance element 220 disposed over the lower contact plug 210 and coupled to the lower contact plug 210, the remaining part 222A to 229A of the variable resistance element 220 disposed over the bottom electrode 221A and coupled to the bottom electrode 221A, the spacer 250 formed on the sidewalls of the variable resistance element 220 and the protective layer 260 covering the variable resistance element 220.

Here, the lower portion of the bottom electrode 221A may be buried in the first interlayer dielectric layer 205 and the upper portion of the bottom electrode 221A may protrude from the first interlayer dielectric layer 205. Also, the upper portion of the bottom electrode 221A may have sidewalls that are aligned with the stacked structure 222A to 229A while the lower portion of the bottom electrode 221A may have sidewalls that are not aligned with the stacked structure 222A to 229A.

The remaining part 222A to 229A of the variable resistance element 220 may include the buffer layer pattern 222A, the seed layer pattern 223A, the free layer pattern 224A, the tunnel barrier layer pattern 225A, the pinned layer pattern 226A, the exchange coupling layer pattern 227A, the magnetic correction layer pattern 228A and the capping layer pattern 229A.

The spacer 250 may include various insulating materials such as silicon oxide, or silicon nitride, or a combination thereof. The protective layer 260 may include an insulating material such as silicon nitride.

The variable resistance element 220 may store data by switching between different resistance states according to a voltage or current applied to the upper end and lower end of the variable resistance element 220 through the lower contact plug 210 and the upper contact plug 280. In particular, if a voltage or current is applied to the variable resistance element 220, the magnetization direction of the free layer pattern 224A may be changed by spin torque transfer. When the magnetization directions of the free layer pattern 224A and the pinned layer pattern 226A are parallel to each other, the variable resistance element 220 may be in a low resistance state to store a particular designated digital data bit such as '0'. Conversely, when the magnetization directions of the free layer pattern 224A and the pinned layer pattern 226A are anti-parallel to each other, the variable resistance element 220 may be in a high resistance state to store a different designated digital data bit such as '1'. In some implementations, the variable resistance element 220 can be configured to store data bit '1' when the magnetization directions of the free layer 130' and the pinned layer pattern 226A are parallel to each other and to store data bit '0' when the magnetization directions of the free layer pattern 224A and the pinned layer pattern 226A anti-parallel to each other.

The magnetization directions of the free layer pattern 224A and the pinned layer pattern 226A may be substantially perpendicular to an interface of the layers, for example, an interface between the free layer pattern 224A and the tunnel barrier layer pattern 225A. In some implementation, the variable resistance element 220 may include a perpendicular MTJ structure. The magnetization direction of the magnetic correction layer pattern 228A may be anti-parallel to the magnetization direction of the pinned layer pattern 226A. As such, when the pinned layer pattern 226A has a downward magnetization direction, the magnetic correction layer pattern 228A may have an upward magnetization direction. When the pinned layer pattern 226A has an upward magnetization direction, the magnetic correction layer pattern 228A may have a downward magnetization direction.

According to the semiconductor memory and the method for fabricating the same as described above, it is possible to selectively and efficiently remove the etch residue 240, which is disposed on the sidewalls of the variable resistance element 220 and formed of the redeposited etch byproducts such as the metal polymer or metal oxide generated in the etch process for forming the variable resistance element 220. The wet cleaning process may be performed using the cleaning composition capable of removing the metal polymer or metal oxide formed on the sidewalls of the variable resistance element 220 without causing damage to the layers included in the variable resistance element 220, for example, the tunnel barrier layer pattern 225A formed of a non-magnetic material. As a result, by applying the wet cleaning process for removing the etch residue 240, it is possible to prevent metallic bridge due to the etch residue 240 and deterioration of magnetization characteristics caused by bending of the element. Therefore, variable resistance element 220 can be improved.

The above and other memory circuits or semiconductor devices based on the disclosed technology can be used in a range of devices or systems. FIGS. 3 to 7 provide some examples of devices or systems that can implement the memory circuits disclosed herein.

Figure 3:
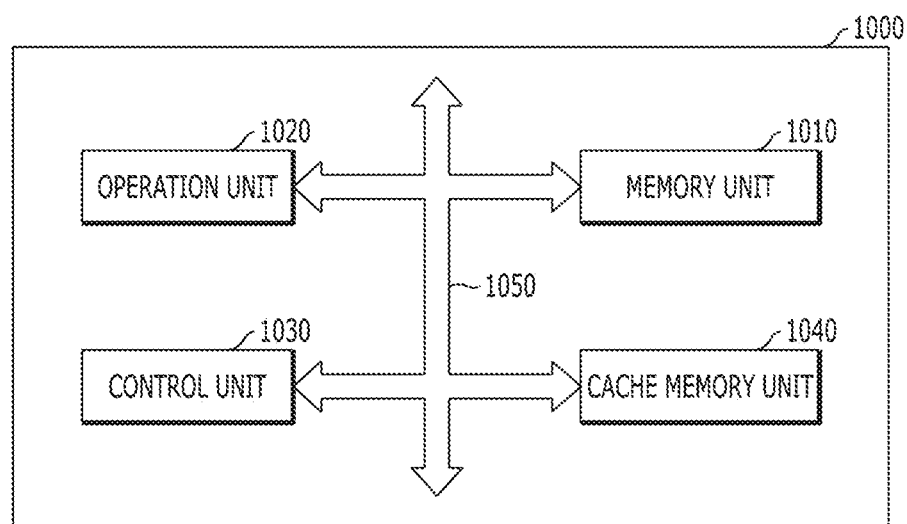
FIG. 3 is an example of configuration diagram of a microprocessor implementing memory circuitry based on the disclosed technology.

FIG. 3 is an example of configuration diagram of a microprocessor implementing memory circuitry based on the disclosed technology.

Referring to FIG. 3, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may be fabricated by one or more of the above-described methods for fabricating semiconductor devices in accordance with the implementations. For example, the memory unit 1010 may be fabricated by a method including forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
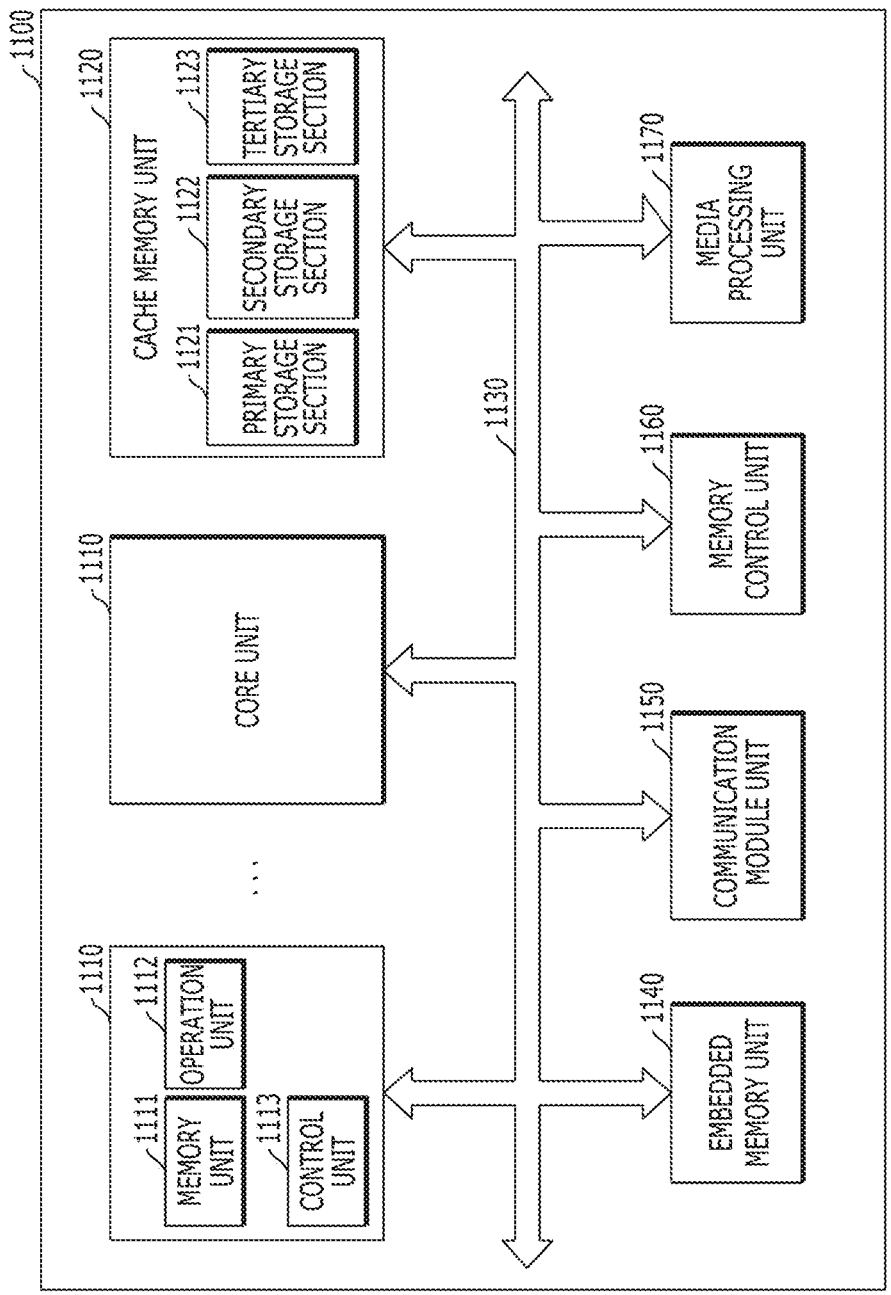
FIG. 4 is an example of configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may be fabricated by one or more of the above-described methods for fabricating semiconductor devices in accordance with the implementations. For example, the cache memory unit 1120 may be fabricated by a method including forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14. Through this, data storage characteristics of the cache memory unit 1120 may be improved. As a consequence, operating characteristics of the processor 1100 may be improved.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
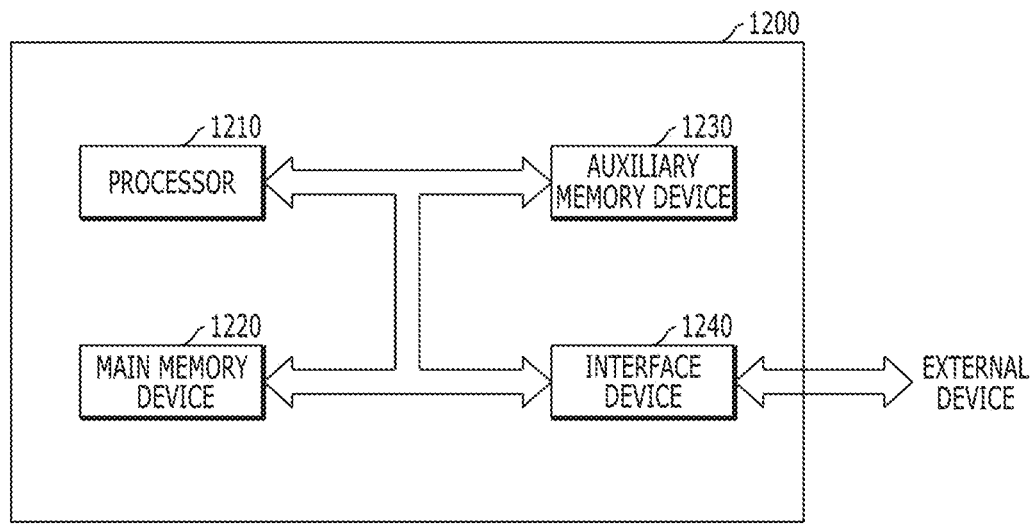
FIG. 5 is an example of configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may be fabricated by one or more of the above-described methods for fabricating semiconductor devices in accordance with the implementations. For example, the main memory device 1220 may be fabricated by a method including forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may be fabricated by one or more of the above-described methods for fabricating semiconductor devices in accordance with the implementations. For example, the auxiliary memory device 1230 may be fabricated by a method including forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
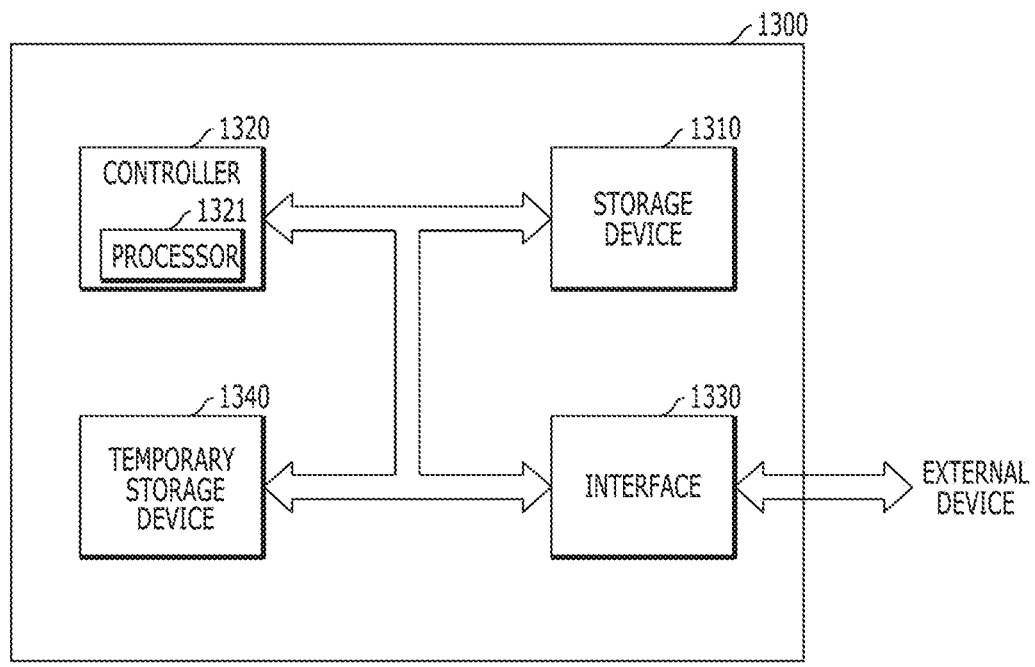
FIG. 6 is an example of configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may be fabricated by one or more of the above-described methods for fabricating semiconductor devices in accordance with the implementations. The temporary storage device 1340 may be fabricated by a method including forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14. Through this, data storage characteristics of the storage device 1310 or the temporary storage device 1340 may be improved. As a consequence, operating characteristics and data storage characteristics of the data storage system 1300 may be improved.

Figure 7:
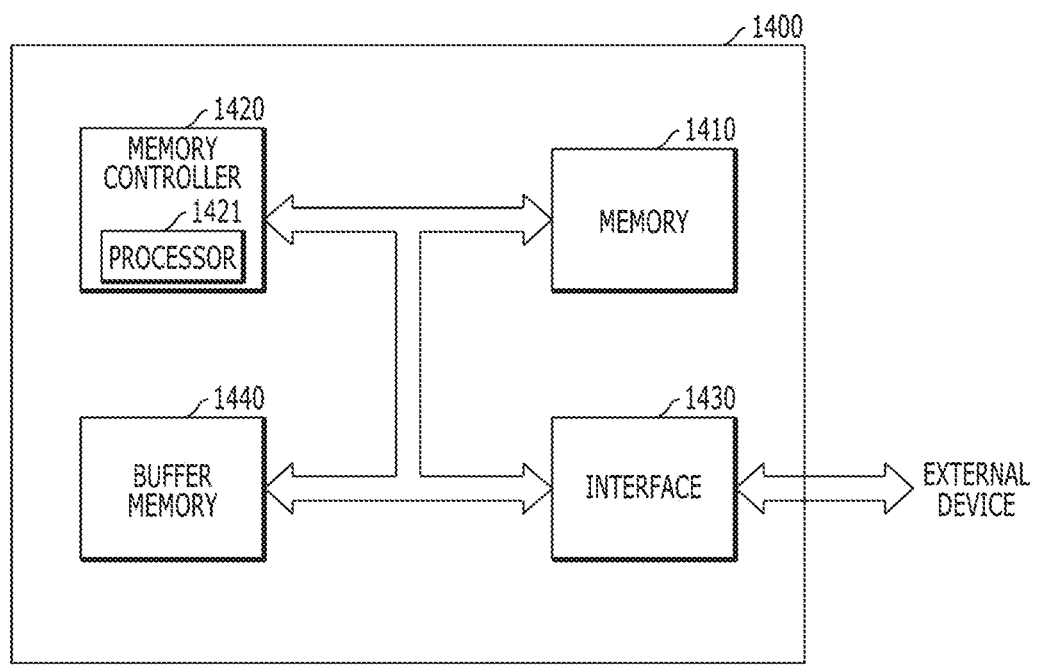
FIG. 7 is an example of configuration diagram of a memory system implementing memory circuitry based on the disclosed technology.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may be fabricated by one or more of the above-described methods for semiconductor devices in accordance with the implementations. For example, the memory 1410 may be fabricated by a method including forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may be fabricated by one or more of the above-described methods for fabricating semiconductor devices in accordance with the implementations. The buffer memory 1440 may be fabricated by a method including forming a material layer over a substrate; forming a material pattern by etching the material layer, the etching providing an etch residue on sidewalls of the material pattern; and removing the etch residue, wherein removing of the etch residue includes performing a cleaning process using a cleaning composition including water and a fluorine-containing compound or an amine, and having a pH in a range of 7 to 14. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 3-7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method for fabricating an electronic device comprising a semiconductor memory, the method comprising:
   forming a material layer over a substrate;
   forming a material pattern by etching the material layer, the etching providing an etch residue on sidewalls of the material pattern; and
   removing the etch residue;
   wherein the removing of the etch residue includes performing a cleaning process using a cleaning composition including water and a fluorine-containing compound or an amine and having a pH in a range of 7 to 14,
   wherein the material pattern includes a variable resistance element including an MTJ (Magnetic Tunnel Junction) structure including a non-magnetic material layer, and wherein the cleaning composition is configured to remove a metal polymer or a metal oxide redeposited on sidewalls of the variable resistance element while preventing or minimizing damage to a non-magnetic material layer included in the MTJ structure.

2. The method of claim 1, wherein the etch residue includes a metal polymer, or a metal oxide, or a combination thereof.

3. The method of claim 2, wherein a metal of the metal polymer or the metal oxide includes Hf, Fe, Al, Co, Mg, Zr, Nb, Mo, Ta, W, or Ti, or a combination thereof.

4. The method of claim 1, wherein the non-magnetic material layer includes an insulating oxide.

5. The method of claim 1, wherein, the fluorine-containing compound includes HF, NaF, KF, AlF$_3$, HBF$_4$, NH$_4$F, NH$_4$HF$_2$, NaHF$_2$, KHF$_2$, or NH$_4$BF$_4$, or a combination thereof.

6. The method of claim 1, wherein the fluorine-containing compound is included in an amount of 1 to 40 wt % of a total weight of the cleaning composition.

7. The method of claim 1, wherein the amine includes hydroxylamine, alkylamine, alkanolamine, or an aromatic amine, or a combination thereof.

8. The method of claim 1, wherein the amine is included in an amount of 1 to 30 wt % of a total weight of the cleaning composition.

9. The method of claim 1, wherein the cleaning composition has a pH in a range of 9 to 11.

10. The method of claim 1, wherein the cleaning composition includes a pH adjusting agent for controlling the pH of the cleaning composition, the pH adjusting agent including NH₄OH, KOH, NaOH, or TMAH (trimethylammonium hydroxide), or a combination thereof.

\* \* \* \* \*